(12) United States Patent
Bliss et al.

(10) Patent No.: US 6,788,482 B2
(45) Date of Patent: Sep. 7, 2004

(54) METHOD AND APPARATUS FOR VITERBI DETECTOR STATE METRIC RE-NORMALIZATION

(75) Inventors: William G. Bliss, Thornton, CO (US); Razmik Karabed, San Jose, CA (US); James W. Rae, Rochester, MN (US); Heiner Stockmanns, Santa Cruz, CA (US)

(73) Assignee: Infineon Technologies AG, Munich (DE)

( * ) Notice: Subject to any disclaimer, the term of this patent is extended or adjusted under 35 U.S.C. 154(b) by 376 days.

(21) Appl. No.: 09/896,134

(22) Filed: Jun. 29, 2001

(65) Prior Publication Data

US 2003/0007270 A1 Jan. 9, 2003

(51) Int. Cl.⁷ ................................................. G11B 5/09
(52) U.S. Cl. .......................... 360/46; 360/65; 714/795; 714/796; 714/792; 714/794; 375/262; 375/265; 375/263; 375/241
(58) Field of Search ...................... 360/65, 46; 375/262, 375/263, 265, 341; 714/792, 794, 795, 796

(56) References Cited

U.S. PATENT DOCUMENTS

| | | | | |
|---|---|---|---|---|
| 6,097,769 A | * | 8/2000 | Sayiner et al. | 375/341 |
| 6,148,431 A | | 11/2000 | Lee et al. | 714/794 |
| 6,178,053 B1 | * | 1/2001 | Narita | 360/25 |
| 6,199,191 B1 | | 3/2001 | Iwata | 714/795 |
| 6,201,840 B1 | * | 3/2001 | Rub et al. | 375/341 |
| 6,219,387 B1 | | 4/2001 | Glover | 375/341 |

FOREIGN PATENT DOCUMENTS

EP  1056 236 A2  11/2000

OTHER PUBLICATIONS

"Exact Bounds for Viterbi Detector Path Metric Differences," Paul H. Siegel, C. Bernard Shung, Thomas D. Howell, Hermant K. Thapar, IBM Corporation, San Jose, CA.

"A 100MBIT/S Viterbi Decorder Chip: Novel Architecture and its Realization," Gerhard Fettweis, Heinrich Meyr, ICC'90, paper No. 257, session 307A, Atlanta GA, USA, Apr. 16–19, 1990.

"Where do we use Viterbi Decoder?" Opencores.org.

"A Tutorial on Convolutional Coding with Viterbi Decoding," Chip Fleming, Spectrum Applications, 1999, http://pw1.netcom.com/~chip.f/viterbi/tutorial.html.

"PRML: Seagate Uses Space Age Technology Today," http://www.seagate.com/support/kb/disc/prml.html.

"PRML," http://www.idema.org/about/industry/ind_tech_prml.html.

(List continued on next page.)

Primary Examiner—Andrew L. Sniezek
Assistant Examiner—Glenda P Rodriguez
(74) Attorney, Agent, or Firm—Brinks Hofer Gilson & Lione

(57) ABSTRACT

A method and apparatus for Viterbi detector state metric re-normalization. The method includes fabricating a Viterbi detector (138) having a predetermined number of states, wherein the Viterbi detector (138) stores a state metric value and a branch metric value for each state, and wherein the Viterbi detector (138) implements a trellis diagram. The method includes constructing a Viterbi detector (138) which can support a state metric value having g+h' number of bits. The number of bits needed to represent the branch metric value is represented by (g) and the additional number of bits needed to represent the state metric value is represented by (h'). The additional number of bits (h') is less than the additional number of bits (h) determined using the following inequality: $2^{h-1} - h \geq K - 1$, wherein K represent the constraint length of the trellis diagram.

14 Claims, 3 Drawing Sheets

OTHER PUBLICATIONS

"Hard Disc Data Encoding and Decoding," http://www.storagereview.com/guide2000/ref/hdd/geom/data.html.
"Technical Requirements for Encoding and Decoding," http://www.storagereview.com/guide2000/ref/hdd/geom/dataRequirements.html.
"Run Length Limited (RLL)," http://www.storagereview.com/guide2000/ref/hdd/geom/dataRLL.html.
"Partial Response, Maximum Likelihood (PRML)," http://www.storagereview.com/guide2000/ref/hdd/geom/dataPRML.html.
"Extended PRML (EPRML)," http://www.storagereview.com/guide2000/ref/hdd/geom/dataEPML.html.
"MR and PRML: Technologies in Synergy—How Advanced Head and Read Channel Technologies Work Together to Increase Capacity and Improve Performance of Desktop Drives—A Quantum White Paper," http://www.lionsgate.com/Home/baden/public_html_index/SCSI/Quantum_White_Papers/MR_Head/MR4/9/01.
"Western Digital Corporation– Glossary, Viterbi Detection," http://www.westerndigital.com/company/glossary.html.
"Description of the Algorithms (Part 1)," http://pw1.netcom.com/~chip.f/viterbi/algrthms.html.
"Synchronous Recording Channels—PRML," KnowledgeTek, Inc., 1999.
"A CMOS Continuous–Time Gm–C Filter for PRML Read Channel Applications at 150 Mb/s and Beyond," Iuri Mehr, David R. Welland, IEEE Journal of Solid State Circuits, vol. 32, No. 4, Apr. 1997.
"A Pipelined 16–State Generalized Viterbi Detector," L. Richard Carley and Srinath Sridnaran, IEEE Transactions On Magnetics, vol. 34, No. 1, Jan. 1998.
"Reduced–Complexity Sequence Detection For $E^2PR4$ Magnetic Recording Channel," Borivoje Nikolie Michale Leung, Leo Fu, Vojin G. Oklobdzja, Richard Yamasaki, General Conference (Part B), Global Telecommunications Conference –Globecom '99, vol. 1b pp. 960–964., 1999.
"A 50 Mbit/s Interative Turbo–Decoder," F. Viglione, G. Masera, G. Piccinini, M. Ruo Roch, M. Zamboni, Proceedings Design, Automation and Test in Europe Conference and Exhibition 200, Proceedings of Meeting on Design Automation and Test in Europe, Paris, France, 27–30, pp. 176–180, 2000.
International Search Report, International Application No. PCT/US 02/19093, pp. 1–2, Sep. 5, 2002.

* cited by examiner

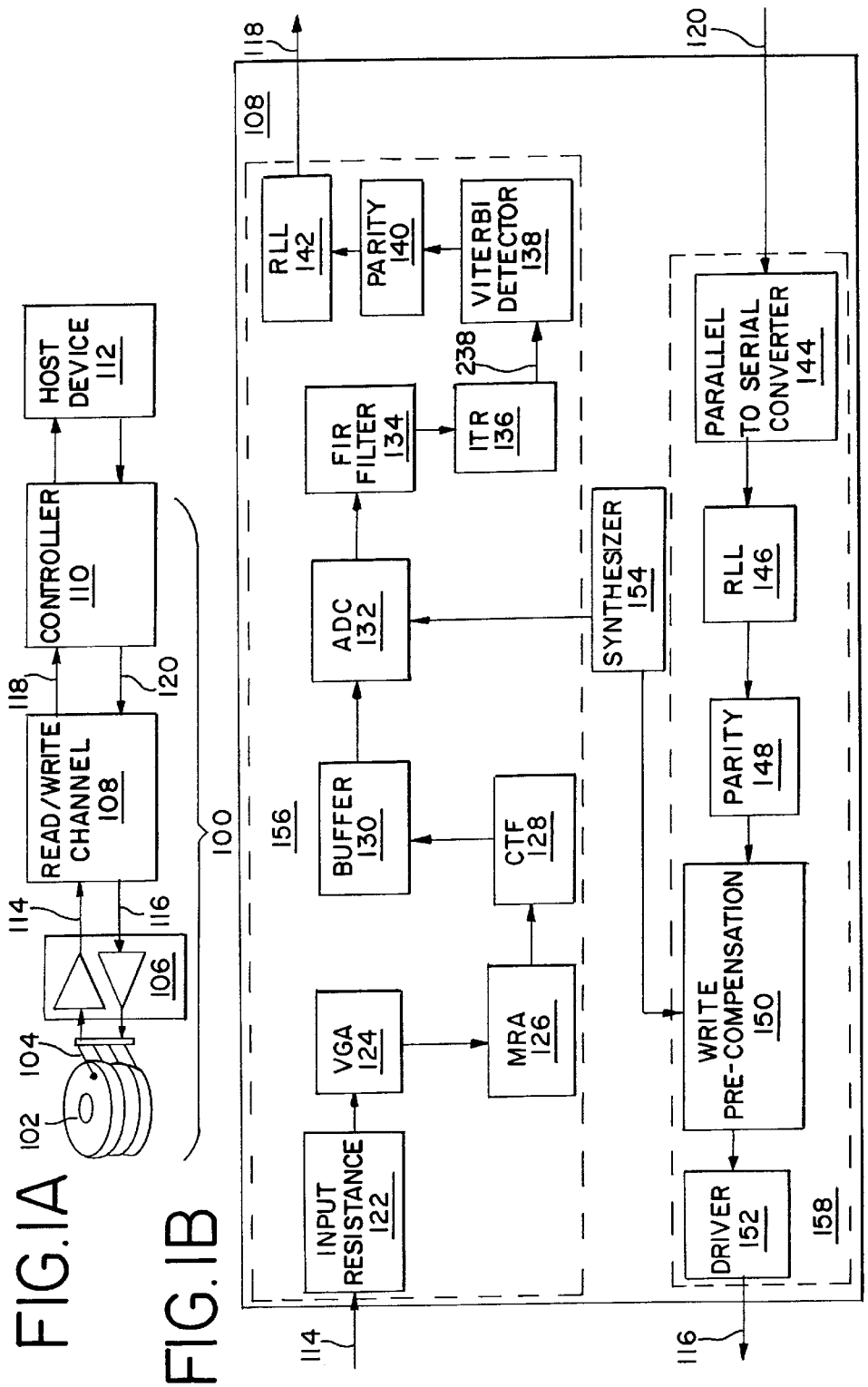

METHOD AND APPARATUS FOR VITERBI DETECTOR STATE METRIC RE-NORMALIZATION

BACKGROUND

Computer hard disk drives, also known as fixed disk drives or hard drives, have become a de facto standard data storage component of modern computer systems and are making further inroads into modern consumer electronics as well. Their proliferation can be directly attributed to their low cost, high storage capacity and high reliability, in addition to wide availability, low power consumption, high data transfer speeds and decreasing physical size.

These disk drives typically consist of one or more rotating magnetic platters encased within an environmentally controlled housing that further includes all of the electronics and mechanics to read and write data and interface with other devices. Read/write heads are positioned above each of the platters, and typically on each face, to record and read data. The electronics of a hard disk drive are coupled with these read/write heads and include numerous components to control the position of the heads and generate or sense the electromagnetic fields representing data. These components receive data from a host device, such as a personal computer, and translate that data into magnetic encodings written onto the disk platters by the heads. Further, when a host device requests data from the drive, the electronics locate the desired data, sense the magnetic encodings which represent that data and translate those encodings back into the binary digital information which the host device can understand. Further, error detection and correction algorithms are applied to ensure accurate storage and retrieval of data.

One area in which significant advancements have been made has been in the area of read/write head technology and the methods of interpreting the magnetic fluctuations sensed by these heads. The read/write head, of which a typical hard disk has several, is the interface between magnetic platters and the disk drive electronics. The read/write head actually reads and writes the magnetically encoded data as areas of magnetic flux on the platters. Data, consisting of binary 1's and 0's, are encoded by sequences of the presence or absence of flux reversals recorded or detected by the read/write head. A flux reversal is a change in the magnetic flux in two contiguous areas of the disk platter. Traditional hard drives read data off the platters by detecting the voltage peak imparted in the read/write head when a flux reversal passes underneath the read/write head as the platters rotate. This is known as "peak detection." However, increasing storage densities require reduced peak amplitudes and better signal discrimination and higher platter rotational speeds are pushing the peaks closer together thus making peak detection more difficult to accomplish.

Magneto-resistive ("MR") read/write heads have been developed with increased sensitivity to sense smaller amplitude magnetic signals and with increased signal discrimination to address some of the problems with increasing storage densities. In addition, another technology, known as Partial Response Maximum Likelihood ("PRML"), has been developed to further address the problems with peak detection as densities and rotational speeds increase. Borrowed from communications technology, PRML is an algorithm implemented in the disk drive electronics to interpret the magnetic signals sensed by the read/write heads. PRML-based disk drives read the analog waveforms generated by the magnetic flux reversals stored on the disk. However, instead of looking for peak values to indicate flux reversals, PRML-based drives digitally sample this analog waveform (the "Partial Response") and use advanced signal processing technologies to determine the bit pattern represented by that wave form (the "Maximum Likelihood"). This technology, in conjunction magneto-resistive ("MR") heads, have permitted manufacturers to further increase data storage densities. PRML technology further tolerates more noise in the sensed magnetic signals permitting the use of lower quality platters and read/write heads which increases manufacturing yields and lowers costs.

With many different drives available from multiple manufacturers, hard disk drives are typically differentiated by factors such as cost/megabyte of storage, data transfer rate, power requirements and form factor (physical dimensions) with the bulk of competition based on cost. With most competition between hard disk drive manufacturers coming in the area of cost, there is a need for enhanced hard disk drive components which prove cost effective in increasing supplies and driving down manufacturing costs all while increasing storage capacity, operating speed, reliability and power efficiency.

SUMMARY

The present invention is defined by the following claims, and nothing in this section should be taken as a limitation on those claims. By way of introduction, the preferred embodiments described below relate to a method for fabricating a Viterbi detector having a predetermined number of states, wherein the Viterbi detector stores a state metric value and a branch metric value for each state, and wherein the Viterbi detector implements a trellis diagram. The method includes constructing a Viterbi detector which can support a state metric value having g+h' number of bits. The number of bits needed to represent the branch metric value is represented by (g) and the additional number of bits needed to represent the state metric value is represented by (h'). The additional number of bits (h') is less than the additional number of bits (h) determined using the following inequality: $2^{h-1} - h \geq K - 1$, wherein K represent the constraint length of the trellis diagram.

The preferred embodiments further relate to a Viterbi detector having a predetermined number of states for conducting maximum likelihood sequence estimation for a predetermined stream of binary data, wherein the Viterbi detector stores a state metric value and a branch metric value for each state, and wherein the Viterbi detector implements a trellis diagram. The Viterbi detector includes a branch metric unit which receives the stream of binary data, determines a branch metric value for each state at a time k+1, and outputs the branch metric value for time k+1. The Viterbi detector also includes an adding unit which receives the branch metric value for time k+1 and adds the branch metric value to a state metric value for time k for each state. The state metric value is represented by a number of bits (g+h'), wherein g is the number of bits needed to represent the branch metric value, and wherein h' is the additional number of bits needed to represent the state metric value. The additional number of bits (h') is less than the additional number of bits (h) determined using the following inequality: $2^{h-1} - h \geq K - 1$, wherein K represents the constraint length of the trellis diagram. Further aspects and advantages of the invention are discussed below in conjunction with the preferred embodiments.

BRIEF DESCRIPTION OF THE DRAWINGS

FIG. 1A depicts a block diagram of an exemplary hard disk drive coupled with a host device.

FIG. 1B depicts a block diagram of a read/write channel for use with the hard disk drive of FIG. 1A.

DETAILED DESCRIPTION OF THE PRESENTLY PREFERRED EMBODIMENTS

Figure 1C:
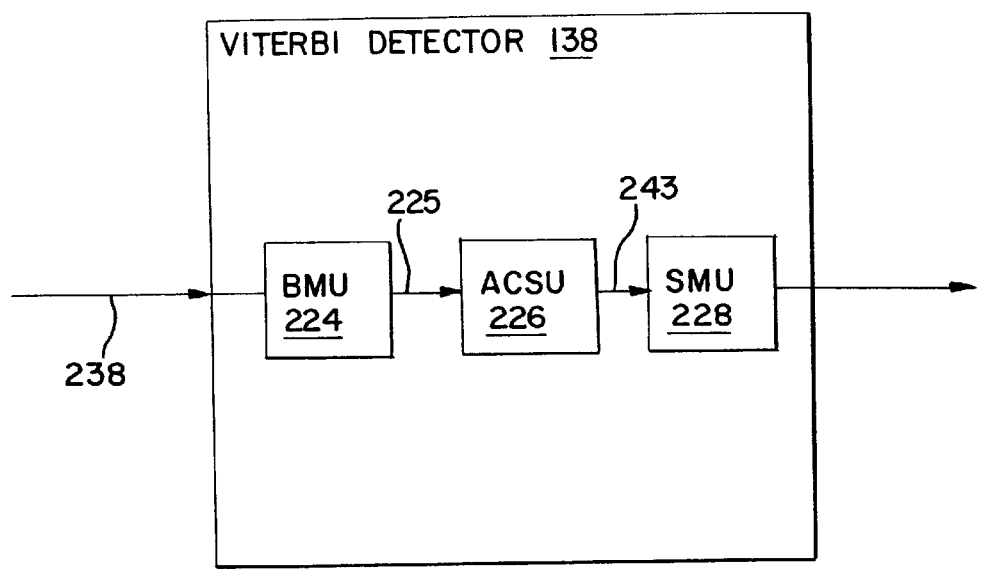
FIG. 1C depicts a block diagram of a Viterbi detector for use with the read/write channel of FIG. 1B.

The embodiments described herein relate to a PRML-based read/write channel device for hard disk drive controllers. The read/write channel is a device coupled with the read/write heads of the hard disk drive. Herein, the phrase "coupled with" is defined to mean directly connected to or indirectly connected with through one or more intermediate components. Such intermediate components may include both hardware and software based components. The read/write channel converts binary/digital data from the host device into the electrical impulses which drive the read/write head to magnetically record the data to the disk drive platters. Further, the read/write channel receives the analog waveform magnetically sensed by the read/write heads and converts that waveform back into the binary/digital data stored on the drive.

Referring to FIG. 1A, there is shown a block diagram of an exemplary hard disk drive 100 coupled with a host device 112. For clarity, some components, such as the servo/actuator motor control, are not shown. The drive 100 includes the magnetic platters and spindle motor 102, the read/write heads and actuator assembly 104, pre-amplifiers 106, a read/write channel 108 and a controller 110. The pre-amplifiers 106 are coupled with the read/write channel 108 via interfaces 114, 116. The controller 110 interfaces with the read/write channel 108 via interfaces 118, 120.

For reads from the hard disk 100, the host device 112 provides a location identifier which identifies the location of the data on the disk drive, e.g. a cylinder and sector address. The controller 110 receives this address and determines the physical location of the data on the platters 102. The controller 110 then moves the read/write heads into the proper position for the data to spin underneath the read/write heads 104. As the data spins underneath the read/write head 104, the read/write head 104 senses the presence or absence of flux reversals, generating a stream of analog signal data. This data is passed to the pre-amplifiers 106 which amplifies the signal and passes it to the read/write channel 108 via the interface 114. As will be discussed below, the read/write channel receives the amplified analog waveform from the pre-amplifiers 106 and decodes this waveform into the digital binary data that it represents. This digital binary data is then passed to the controller 110 via the interface 118. The controller 110 interfaces the hard drive 100 with the host device 112 and may contain additional functionality, such as caching or error detection/correction functionality, intended to increase the operating speed and/or reliability of the hard drive 100.

For write operations, the host device 112 provides the controller 110 with the binary digital data to be written and the location, e.g. cylinder and sector address, of where to write it. The controller 110 moves the read/write heads 104 to the proper location and sends the binary digital data to be written to the read/write channel 108 via interface 120. The read/write channel 108 receives the binary digital data, encodes it and generates analog signals which are used to drive the read/write head 104 to impart the proper magnetic flux reversals onto the magnetic platters 102 representing the binary digital data. The generated signals are passed to the pre-amplifiers 106 via interface 116 which drive the read/write heads 104.

Referring to FIG. 1B, there is shown an exemplary read/write channel 108 supporting Partial Response Maximum Likelihood ("PRML") encoding technology for use with the hard disk drive 100 of FIG. 1A. For clarity, some components have been omitted. The read/write channel 108 is implemented as an integrated circuit using a complementary metal oxide semiconductor ("CMOS") process at 0.18 micron. It will be appreciated that CMOS processes include processes which use metal gates as well as polysilicon gates. It will further be appreciated that other process technologies and feature sizes may used and that the circuitry disclosed herein may be further integrated with other circuitry comprising the hard disk electronics such as the hard disk controller logic. As was described, the read/write channel 108 converts between binary digital information and the analog signals representing the magnetic flux on the platters 102. The read/write channel 108 is divided into two main sections, the read channel 156 and the write channel 158.

The write channel 158 includes a parallel-to-serial converter 144, a run-length-limited ("RLL") encoder 146, a parity encoder 148, a write pre-compensation circuit 150 and a driver circuit 152. The parallel-to-serial converter 144 receives data from the host device 112 via interface 120 eight bits at a time. The converter 144 serializes the input data and sends the serial bit stream to the RLL encoder 146. The RLL encoder 146 encodes the serial bit stream into symbolic binary sequences according to a known run-length limited algorithm for recording on the platters 102. The exemplary RLL encoder uses a 32/33 bit symbol code to ensure that flux reversals are properly spaced and that long runs of data without flux reversals are not recorded. The RLL encoded data is then passed to the parity encoder 148 which adds a parity bit to the data. In the exemplary parity encoder 148, odd parity is used to ensure that long run's of 0's and 1's are not recorded due to the magnetic properties of such recorded data. The parity encoded data is subsequently treated as an analog signal rather than a digital signal. The analog signal is passed to a write pre-compensation circuit 150 which dynamically adjusts the pulse widths of the bit stream to account for magnetic distortions in the recording process. The adjusted analog signal is passed to a driver circuit 152 which drives the signal to the pre-amplifiers 106 via interface 116 to drive the read/write heads 104 and record the data. The exemplary driver circuit 152 includes a pseudo emitter coupled logic ("PECL") driver circuit which generates a differential output to the pre-amplifiers 106.

The read channel 156 includes an attenuation circuit/input resistance 122, a variable gain amplifier ("VGA") 124, a magneto-resistive asymmetry linearizer ("MRA") 126, a continuous time filter ("CTF") 128, a buffer 130, an analog to digital converter ("ADC") 132, a finite impulse response ("FIR") filter 134, an interpolated timing recovery ("ITR") circuit 136, a Viterbi detector 138, a parity decoder 140 and a run-length-limited ("RLL") decoder 142. The amplified magnetic signals sensed from the platters 102 by the read/write head 104 are received by the read/write channel 108 via interface 114. The analog signal waveform representing the sensed magnetic signals is first passed through an input resistance 122 which is a switching circuit to attenuate the signal and account for any input resistance. The attenuated signal is then passed to a VGA 124 which amplifies the signal. The amplified signal is then passed to the MRA 126 which adjusts the signal for any distortion created by the recording process. Essentially, the MRA 126 performs the opposite function of the write-pre-compensation circuit 150 in the write channel 158. The signal is next passed through the CTF 128, which is essentially a low pass filter, to filter out noise. The filtered signal is then passed to the ADC 132 via the buffer 130 which samples the analog signal and converts it to a digital form. The digital signal is then passed to a FIR filter 134 and then to a timing recovery circuit 136. The timing recovery circuit 136 is connected (not shown in the figure) to the FIR filter 134, the MRA 126 and the VGA 124 in a feedback orientation to adjust these circuits according to the signals received to provide timing compensation. The exemplary FIR filter 134 is a 10 tap FIR filter. The digital signal is then passed to the Viterbi detector 138 which determines the binary bit pattern represented by the digital signal using digital signal processing techniques. The exemplary Viterbi detector 138 uses a 32 state Viterbi processor. The binary data represented by the digital signal is then passed to the parity decoder 140 which removes the parity bit and then to the RLL decoder 142 which decodes the binary RLL encoding symbols back into the actual binary data that they represent. This data is then passed to the controller 110 via the interface 118.

The read/write channel 108 further includes a clock synthesizer 154. The clock synthesizer 154 generates the clock signals required for operating the read/write channel 108. The exemplary clock synthesizer 154 includes a phased lock look ("PLL") (not shown) with a voltage controlled oscillator and various clock dividers to generate the necessary frequencies.

In accordance with one preferred embodiment, a method for state metric re-normalization of the Viterbi detector 138 is described. The Viterbi detector 138 is a maximum likelihood detector or Viterbi decoder implementing the Viterbi algorithm for analyzing the partial response signal provided by the discrete, equalized signal of the FIR filter 134 and the ITR circuit 136, as illustrated in FIGS. 1B and 1C. The Viterbi detector 138 generates a digital binary data output signal in response which is received by the parity decoder 140. In performing maximum likelihood detection, the Viterbi algorithm provides an iterative method for determining the best path along branches of a trellis diagram. The maximum likelihood detection involves analyzing a number of consecutive data samples to determine the most likely path. Thus, by analyzing a number of consecutive samples, the most likely sequence can be chosen. The Viterbi detector 138 implements a predetermined trellis diagram by having a given number of states, wherein for each state, the Viterbi detector 138 determines a branch metric value for each branch entering the state, a state metric value, and a survivor branch. In order to accomplish this task, the Viterbi detector 138 includes a branch metric unit (BMU) 224, an add-compare-select unit (ACSU) 226, and a survivor memory unit (SMU) 228, as illustrated in FIG. 1C. An example of one implementation of a Viterbi detector is described in greater detail in a paper entitled "A 100MBIT/S Viterbi Detector Chip: Novel Architecture And Its Realization," written by Gerhard Fettweis and Heinrich Meyr, presented to the ICC in 1990, in Atlanta, Ga., on Apr. 16–19, 1990, given paper no. 257, at session 307A, the entire disclosure of which is incorporated herein by reference.

For simplicity, the following description of the Viterbi detector 138 will be limited to describing only one state, even though the Viterbi detector 138 may have more than one state, as known by those skilled in the art. In one preferred embodiment, the Viterbi detector is a 32 state detector wherein each state comprises 4 bits.

During a read cycle, the branch metric unit 224 receives a stream of binary digital data 238 from the FIR filter 134 and the ITR circuit 136, determines a branch metric value (Q) for each state at a time k+1, and outputs the branch metric value (Q) for time k+1 within a branch metric signal 225. The branch metric signal 225 includes the branch metric value (Q) for each discrete, equalized value of the binary data 238. The branch metric value (Q) is provided in a binary representation, and has a length of (g) bits. The branch metric value (Q) may be calculated using any one of a number of algorithms commonly used for calculating branch metric values.

Figure 1D:
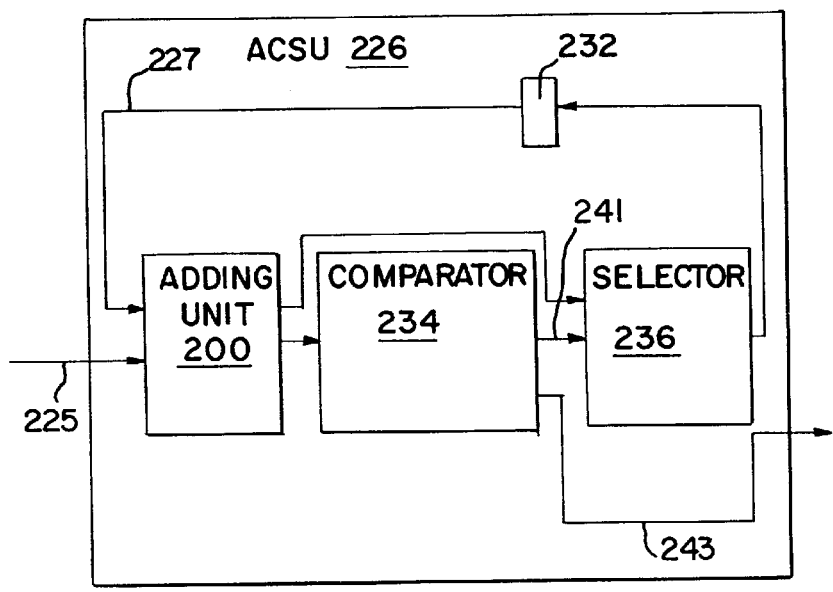
FIG. 1D depicts a block diagram of an Add-Compare-Select Unit for use with the Viterbi detector of FIG. 1C.

The branch metric signal 225 containing the branch metric value (Q) for time k+1 is then input into the ACSU 226 along with a state metric signal 227 containing a state metric value (M) for time k. At any time k, the state metric value (M) indicates a cost associated with the best path through the trellis diagram to the state, and is therefore a measure for the likelihood of this particular path. Preferably, the state metric value (M) is stored in a memory device, such as a latch 232. If latch 232 is used to store the state metric value (M), the latch 232 must be able to store g+h binary bits. The ACSU 226 includes an adding unit 200, a comparator 234, a selector 236, and a latch 232, as illustrated in FIG. 1D.

The adding unit 200 is illustrated in more detail in FIG. 2, and described in more detail below. The adding unit 200 adds the branch metric value (Q) for time k+1 for a given state to the state metric value (M) for time k for a given state to obtain a state metric value (M) for time k+1 for a given state. The state metric value (M) for time k is stored in latch 232, and received by adding unit 200, as illustrated in FIG. 1D. The adding unit 200 outputs the state metric value (M) for time k+1 for a given state to the comparator 234 and the selector 236. Typically, more than one state metric value (M) for time k+1 exists for any given state, and all these value are output by the adding unit 200. The comparator 234 receives the output of the adding unit 200 containing all the state metric values (M) for time k+1 for a given state and then compares all the state metric values (M) for time k+1 for the given state. The comparator 234 then generates a control input 241 for the selector 236. Additionally, the comparator 234 outputs a control signal 243 which is received by the SMU 228. The selector 236 receives the control input 241 from the comparator 234 and the output from the adding unit 200 containing all the state metric values (M) for time k+1 for a given state, and selects a state metric value (M) for time k+1, which is then stored in latch 232. Preferably, the selector 236 selects the largest state metric value (M) for time k+1 for a given state, and outputs that value to the latch 232.

The survivor memory unit (SMU) 228 receives and processes the control signal 243 from the ACSU 226, and more particularly from the comparator 234, as illustrated in FIG. 1C. The SMU 228 processes the signal received from the ACSU 226, and generates a digital binary data output signal in response which is received by the parity decoder 140.

Figure 2:
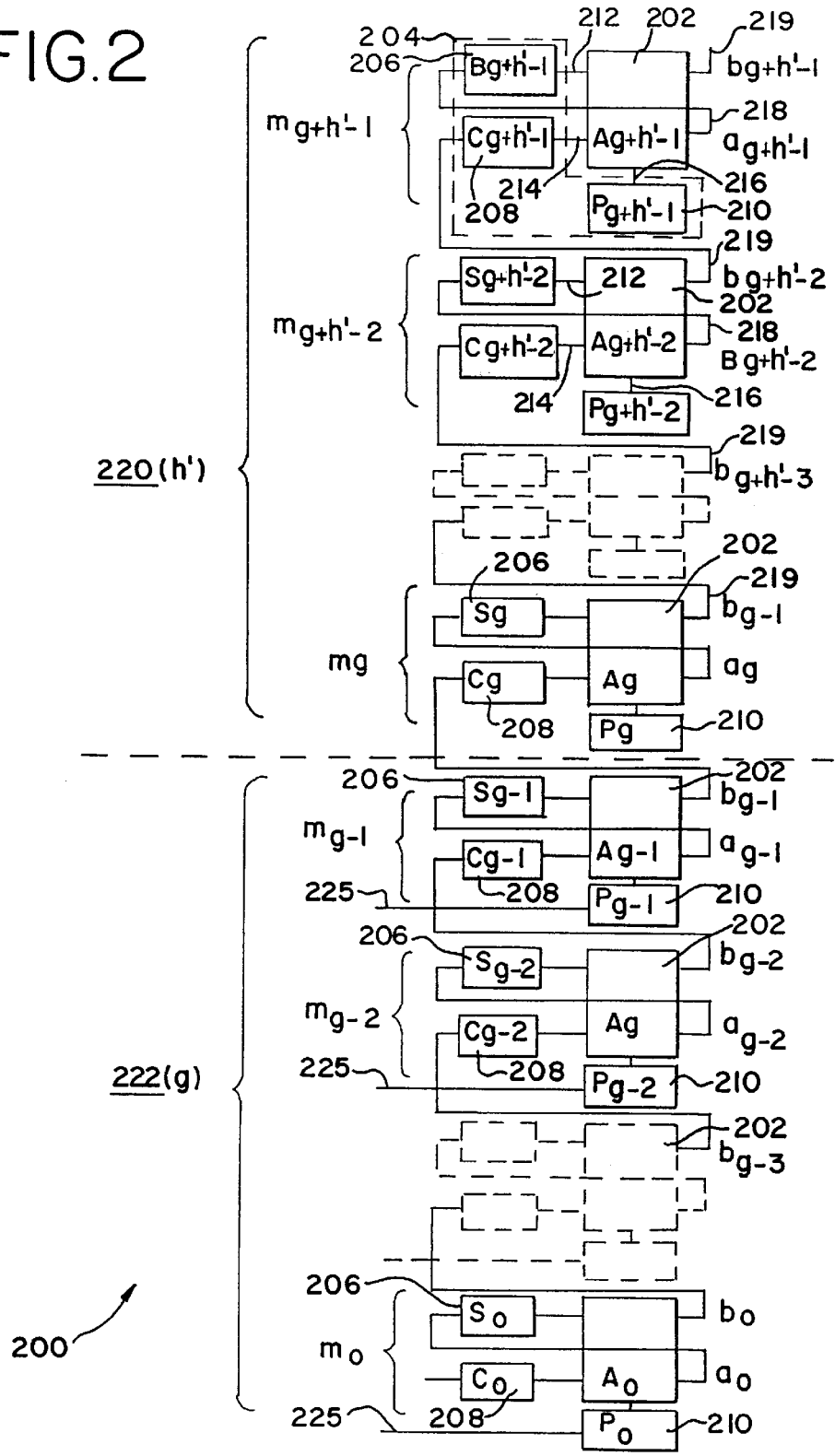
FIG. 2 depicts a block diagram of an adder for use with the Add-Compare-Select Unit of FIG. 1D.

FIG. 2 illustrates a portion of the adding unit 200. The adding unit 200 comprises adders ($A_i$) 202, S Latches ($S_i$)

206, C Latches ($C_i$) 208, and P Latches ($P_i$) 210. The adding unit 200 receives the branch metric value (Q) for time k+1 and adds the branch metric value (Q) for time k+1 to the state metric value (M) for time k for each state, wherein the state metric value (M) is represented by a number of bits (g+h), wherein g is the number of bits needed to represent the branch metric value and wherein h is the additional number of bits needed to represent the state metric value. Typically, the additional number of bits (h) is determined using the following inequality:

$$2^{h-1} - h \geq K - 1, \quad [1]$$

wherein K represents the constraint length of the trellis diagram. Since K is a value that is known for a given Viterbi detector, h can be determined using inequality [1].

The operation of the addition unit 200 is as follows. The branch metric value (Q) is a non-negative integer provided in a binary representation. The binary representation of the branch metric value (Q) is given by $[m_0, m_1, m_2, \ldots, m_{g-1}]$, $m_i \text{Å} \{0,1\}$, where:

$$Q = \sum_{i=0}^{L} 2^i \times m_i. \quad [2]$$

The state metric value (M) is provided in a carry save representation. The carry save representation of the state metric value (M) is given by be represented by a carry save representation $[(m1_0, m2_0), (m1_1, m2_1), \ldots, (m1_{g+h-1}, m2_{g+h-1})]$, $m1_i$ and $m2_i \text{Å} \{0,1\}$, where:

$$M = \sum_{i=0}^{L} 2^i \times (m1_i + m2_i). \quad [3]$$

While the binary representation of the branch metric value (Q) is unique, in general, the carry save representation of the state metric value (M) is not unique.

The values for $m1_i$, which are also known as save bits ($s_i$), are stored in S Latches 206, as illustrated in FIG. 2. The values for $m2_i$, which are also known as carry bits ($c_i$), are stored in C Latches 208, as illustrated in FIG. 2. The save bits ($s_i$) and the carry bits ($c_i$) represent the state metric value (M). Additionally, the values for $m_i$, which are also known as binary bits ($p_i$), which represent the branch metric value (Q), are stored in P Latches 210.

The addition unit 200 adds the branch metric value (Q) for a particular state for time k+1 to the state metric value (M) for a particular state for time k, in order to arrive at a state metric value (M) for a particular state for time k+1, as illustrated in FIG. 2. The addition unit 200 comprises a top set 220 and a bottom set 222 of adders 202 ranging from $A_0$ to $A_{g+h-1}$, that is, the addition unit 200 comprises g+h adders 202. Adders 202 may be full adders or half adders, as described below. More specifically, the top set 220 includes h number of adders ($A_i$) 202 ranging from $A_g$ to $A_{g+h-1}$, and the bottom set (g) 222 includes g number of adders ($A_i$) 202 ranging from $A_0$ to $A_{g-1}$, as illustrated in FIG. 2. Every adder ($A_i$) 202 has at least two latches: an S latch ($S_i$) 206, and a C latch ($C_i$) 208. Therefore there are also g+h number of S latches ($S_i$) 206 and g+h number of C latches ($C_i$) 208. Additionally, every full adder has a P latch ($P_i$) 210. Therefore there are at least g number of P latches ($P_i$) 210. The input latches 204 include S latch ($S_i$) 206, C latch ($C_i$) 208, and P latch ($P_i$) 210 that provide an s input 212, a c input 214, and a p input 216 to each full adder 202, respectively.

In addition, every adder ($A_i$) 202 has a first output ($a_i$) 218 and a second output ($b_i$) 219. The outputs ($a_i, b_i$) 218, 219 are generated as follows:

$$a_i = s_i \oplus c_i \oplus p_i; \quad [4]$$

and $$b_i = (s_i \oplus c_i) v (s_i \oplus p_i) v (c_i \oplus p_i), \quad [5]$$

wherein $\oplus$, v, and $\oplus$ denote EXCLUSIVE OR, OR, and AND operations, respectively.

The adders ($A_i$) 202 in the top set 220 may be half adders, since no binary bits ($p_i$) are input into the P Latches 210 of the top set 220, and thus the P latches 210 of the top set 220 are not required.

If we let T to denote a discrete time sequence. And for $0 \leq i \leq g+h-1$, let $s_i(k)$, $c_i(k)$, and $p_i(k)$, stand for the values of s input 212, c input 214, and p input 216 which are then the outputs of S latch ($S_i$) 206, C latch ($C_i$) 208, and P latch ($P_i$) 210 at time T=k, respectively. Also if we let L1 and L2 to be defined as follows:

$$L1(k) = [(s_0(k), c_0(k)), (s_1(k), c_1(k)), \ldots, (s_{g+h-1}(k), c_{g+h-1}(k))], \quad [6]$$

and $$L2(k) = [p_0(k), p_1(k), \ldots, p_{g+h-1}(k)]. \quad [7]$$

We will use L1 (L2) to also represent an integer number corresponding to L1 (L2) above. Now, referring to FIG. 2, the addition of state metric value (M) and branch metric value (Q) is performed. First, at time T=0, the input latches 204 are set such that:

$$L1(0) = [(m1_0, m2_0), (m1_1, m2_1), \ldots, (m1_{g+h-1}, m2_{g+h-1})], \quad [8]$$

and $$L2(0) = [q_0, q_1, \ldots, q_{g-1}, 0, \ldots, 0]. \quad [9]$$

Upon setting the input latches 204, the addition unit 200 generates the first output ($a_i$) 218 and the second output ($b_i$) 219, for $0 \leq i \leq g+h-1$. Next, the addition unit 200 latches these values at time T=1 such that:

$$s_i(1) = a_i, \text{ for } 0 \leq i \leq g+h-1, \quad [10]$$

$$c_i(1) = b_{i-1}, \text{ for } 1 \leq i \leq g+h-1, \quad [11]$$

and $$c_0(1) = 0. \quad [12]$$

If the second output ($b_{g+h-1}$) 219 equals zero, then L1(1)= M+Q, otherwise the second output ($b_{g+h-1}$) 219 equals one, and we have an "addition overflow" condition.

During a cumulative addition of state metric value (M) and branch metric value (Q), if we let L1(0)=M, L2(0)=Q1, L2(1)=Q2, ..., and L2(k-1)=Qk, we will generate L1(1)-L1(k) using the addition unit 200. Moreover, assuming that input latches ($S_i$'s, $C_i$'s, and $P_i$'s) 204 all latch just prior to each time T, then:

$$L1(i) = M + Q1 + \ldots + Qi, \text{ for } 1 \leq i \leq k. \quad [13]$$

We now arrive at the following three propositions.
Proposition A:
If we assume that during a cumulative addition process $(s_i, c_i) = (1,1)$ at time T=k, for some integer, k, and some $g \leq i \leq g+h-1$, then at a time T=j, wherein j=k-(i-g+1), we would have:

$$[(s_g(j),c_g(j)),(s_{g+1}(j),c_{g+1}(j)), \ldots ,(s_i(j),c_i(j))]=[(1,0),(1,0), \ldots ,(1,0)],$$ [14]

and at time T=j, wherein k−i+g≤j≤k, we would have:

$$[(s_w(j),c_w(j)),(s_{w+1}(j),c_{w+1}(j)), \ldots ,(s_i(j),c_i(j))]=[(1,1),(1,0), \ldots ,(1,0)],$$ [15]

where w=j−k+i.

Proposition B:

If we also assume that in a cumulative addition process, starting with M=0, we let $E_{min}$ to denote the minimum number represented by L1(k), over all time T=k, such that:

$$(m1_{g+h-1},m2_{g+h-1})=(1,1),$$ [16]

then, we would have:

$$E_{min} \geq 2^{g+h}$$ [17]

Proposition C:

Finally, if we assume that in a cumulative addition process, starting with M=0, we let $F_{max}$ to denote the maximum number represented by L1(k) over all k such that:

$$(m1_{g+h-1},m2_{g+h-1})=(0,0),$$ [18]

then, we would have:

$$F_{max} \leq 2^{g+1}-3+2^{g+h-1}-2^g+(h-1) \times Q_{max},$$ [19]

where $Q_{max}$ is an upper bound to Qi's. If Qi's are unrestricted then $Q_{max}$ is $2^g-1$.

Equation [19], and thus Proposition C, may be proved, without loss of generality, by assuming $(m1_{g+h-2},m2_{g+h-2})=(1,1)$. We then let time T=k* to denote a time T when $F_{max}$ is achieved. Using Proposition A, at time T=k*−(h−1), we then have:

$$[(s_g(j),c_g(j)),(s_{g+1}(j),c_{g+1}(j)), \ldots ,(s_{g+h-2}(j),c_{g+h-2}(j))]=[(1,0),(1,0), \ldots ,(1,0)].$$ [20]

Therefore,

L1(k*−(h−1))≤[$(u_0,v_0),(u_1, v_1), \ldots (u_{g-1}, v_{g-1}), (u_g, v_g), (u_{g+1}, v_{g+1}), \ldots ,(u_{g+h-1}, v_{g+h-1})$], where $(u_0, v_0)=(1,0)$, $(u_j, v_j)=(1,1)$ for 1≤j≤g−1, $(u_j,v_j)=(1,0)$ for g≤j ≤g+h−2, and $(u_{g+h-1}, v_{g+h-1})=(0,0)$. Equivalently, we have:

$$L1(k*-(h-1)) \leq 2 \times (2^g-1)-1+2^{g+h-1}=2^{g+1}-3+2^{g+h-1}-2^g$$ [21]

But, $$L1(k*) \leq L1(k*-(h-1))+(h-1)*Q_{max}.$$ [22]

Hence, we have:

$$L1(k*) \leq L1(k-(h-1))+(h-1)*Q_{max} \leq 2^{g+1}-3+2^{g+h-1}-2^g+(h-1)*Q_{max},$$ [23]

and the proof is completed.

As discussed above, the re-normalization method uses numbers g and h, wherein g represents the number of bits needed to represent and store the branch metric value (Q), and h represents the additional number of bits required to represent and store the state metric value (M) in the Viterbi detector 138. Since h represents the additional number of bits required to represent and store the state metric value (M) in the Viterbi detector 138, g+h represents the number of bits required to represent and store the state metric value (M) in the Viterbi detector 138. Using the following re-normalization inequality:

$$2^{g+h'}-[2^{g+1}-3+2^{g+h'-1}-2^g+(h'-1) \times Q_{max}] \geq D_{max}+1,$$ [24]

which was obtaining using the above Propositions, we are able to obtain a new value h' for the additional number of bits required to represent and store the state metric value (M), which is less than the value for h found using equation [1] $2^{h-1}-h \geq K-1$. By using a lower value for h, a Viterbi detector 138 can be designed and fabricated which uses less complex hardware, since the number of bits (g+h) needed to represent and store the state metric value (M) would also be reduced. Reducing the number of bits (g+h) needed to represent and store the state metric value (M), allows us to fabricate Viterbi detector 138 with a smaller latch 232, and with less adders 202 in the adding unit 200, as illustrated in FIG. 2.

More specifically, by using a new, lower value for h', which represents the additional number of bits required to represent and store the state metric value (M), we are able to design and fabricate an addition unit 200 for the Viterbi detector 138 having g+h' number of adders 202, as illustrated in FIG. 2. Additionally, we are able to design and fabricate an addition unit 200 for the Viterbi detector 138 having g+h' number of S latches ($S_i$) 206, g+h' number of C latches ($C_i$) 208, and no more than g+h' number of P latches ($P_i$) 210.

Referring to re-normalization inequality [24], the parameter $D_{max}$ is the maximum difference between Viterbi state metric values over all state pairs and over all time. The parameters $Q_{max}$ and $D_{max}$ can be computed for a given Viterbi detector, as known by those skilled in the art. An example of the computation of $D_{max}$ is described in greater detail in a paper entitled "Exact bounds for Viterbi detector path metric differences," written by P. Siegel, C. Shung, T. Howell, and H. Thapar, Proc. of 1991 IEEE Int. Conf. on Acoustics, Speech, and Signal Proc. (ICASSP'91), in Toronto, on May 14–17, 1991, the entire disclosure of which is incorporated herein by reference.

Nevertheless, the following example of the computation of $Q_{max}$ and $D_{max}$ for a given Viterbi detector 138, is provided. Given a Viterbi detector 138 matched to a signaling target $3+2D-2D^2-2D^3-D^4$, the tradition inequality [1], $2^{h-1}-h \geq K-1$, wherein K represent the constraint length of the trellis diagram, gives us an h equal to 4. However, using our new re-normalization inequality [24], $2^{g+h'}-[2^{g+1}-3+2^{g+h'-1}-2^g+(h-1) \times Q_{max}] \geq D_{max}+1$, gives us a reduced value for h,h', which is equal to 3. For example, the value for the parameters $Q_{max}$ and $D_{max}$ from the re-normalization inequality [24] are $Q_{max}$=384, $D_{max}$=750, g=9, and h=3.

Advantages of using the above-described method for state metric re-normalization of the Viterbi detector 138 include: 1) less complex hardware; 2) less delay; and 3) less power consumption for Viterbi detection. More specifically, in one case, a Viterbi detector may be implemented with 12 bit state metric values (M) instead of 13 bit state metric values (M). While the above-described detector 138 is described in relation to only one state, the Viterbi detector 138 may have additional states, wherein a state metric value (M) for time k+1, a branch metric value (Q) for time k+1, and a survivor are calculated for each state, as known by those skilled in the art.

It is to be noted that suitable transistor sizes specifying channel width-to-length ratios (measured in micrometers or microns) for the transistors which make up the depicted circuits have been omitted from the figures. It will be appreciated that suitable ratios may be chosen depending on the design requirements and the capabilities and limitations of the particular integrated circuit fabrication process used for implementation of the circuit as well as the performance requirements of the specific embodiment.

Thus, there has been disclosed in accordance with the invention, a method for Viterbi detector state metric re-normalization for a Viterbi detector of a read/write channel for a hard disk drive that fully provides the advantages set forth above. Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications that fall within the scope of the appended claims and equivalents thereof.

We claim:

1. A method for fabricating a Viterbi detector having a predetermined number of states, wherein the Viterbi detector stores a state metric value and a branch metric value for each state, and wherein the Viterbi detector implements a trellis diagram, the method comprising:

constructing a Viterbi detector which can support a state metric value having g+h' number of bits, wherein g is the number of bits needed to represent the branch metric value, wherein h' is the additional number of bits needed to represent the state metric value, and wherein the additional number of bits (h') is less than the additional number of bits (h) determined using the following inequality: $2^{h-1} - h \geq K - 1$, wherein K represent the constraint length of the trellis diagram.

2. The method of claim 1, wherein the determining the additional number of bits (h') needed to represent the state metric value further comprises using the following inequality:

$$2^{g+h'} - [2^{g+1} - 3 + 2^{g+h'-1} - 2^g + (h'-1) \times Q_{max}] \geq D_{max} + 1$$

wherein $D_{max}$ represents the maximum difference between Viterbi state metric values over all state pairs and over all time and $Q_{max}$ represents the upper bound of the binary representation branch metric value Q.

3. The method of claim 1, further comprising constructing a add-compare-select unit for the Viterbi detector which can support a state metric value having g+h' number of bits.

4. The method of claim 3, further comprising constructing an adding unit for the Viterbi detector, wherein the adding unit comprises g+h' number of adders.

5. The method of claim 3, further comprising constructing an adding unit for the Viterbi detector, wherein the adding unit comprises g+h' number of S latches and g+h' number of C latches.

6. A Viterbi detector having a predetermined number of states for conducting maximum likelihood sequence estimation for a predetermined stream of binary data, wherein the Viterbi detector stores a state metric value and a branch metric value for each state, and wherein the Viterbi detector implements a trellis diagram, the Viterbi detector comprising:

a branch metric unit which receives the stream of binary data, determines a branch metric value for each state at a time k+1, and outputs the branch metric value for time k+1; and an adding unit which receives the branch metric value for time k+1 and adds the branch metric value to a state metric value for time k for each state, wherein the state metric value is represented by a number of bits (g+h'), wherein g is the number of bits needed to represent the branch metric value, wherein h' is the additional number of bits needed to represent the state metric value, and wherein the additional number of bits (h') is less than the additional number of bits (h) determined using the following inequality: $2^{h-1} - h \geq K - 1$, wherein K represents the constraint length of the trellis diagram.

7. The Viterbi detector of claim 6, wherein the additional number of bits (h') needed to represent the state metric value is determined using the following inequality:

$$2^{g+h'} - [2^{g+1} - 3 + 2^{g+h'-1} - 2^g + (h'-1) \times Q_{max}] \geq D_{max} + 1$$

wherein $D_{max}$ represents the maximum difference between Viterbi state metric values over all state pairs and over all time and $Q_{max}$ represents the upper bound of the binary representation branch metric value Q.

8. The Viterbi detector of claim 6, wherein the adding unit comprises g+h adders.

9. A method for conducting maximum likelihood sequence estimation for a predetermined stream of binary data using a Viterbi detector having a predetermined number of states and implementing a trellis diagram, the method comprising:

receiving the stream of binary data;

determining a state metric value and a branch metric value for each state, wherein the state metric value is represented by a number of bits (g+h'), wherein g is the number of bits needed to represent the branch metric value, wherein h is the additional number of bits needed to represent the state metric value, and wherein the additional number of bits (h') is less than the additional number of bits (h) determined using the following inequality: $2^{h-1} - h \geq K - 1$, wherein K represent the constraint length of the trellis diagram.

10. The method of claim 9, wherein the additional number of bits (h') needed to represent the state metric value further comprises using the following inequality:

$$2^{g+h'} - [2^{g+1} - 3 + 2^{g+h'-1} - 2^g + (h'-1) \times Q_{max}] \geq D_{max} + 1$$

wherein $D_{max}$ represents the maximum difference between Viterbi state metric values over all state pairs and over all time and $Q_{max}$ represents the upper bound of the binary representation branch metric value Q.

11. The method of claim 9, further comprising updating the state metric value and the branch metric value for each state.

12. A read/write channel for a hard disk drive, comprising:

a write channel which receives a digital signal from a controller and outputs an analog signal to a pre-amplifier; and a read channel which receives an analog signal from the pre-amplifiers and outputs a digital signal to the controller, the read channel comprising a Viterbi detector, wherein the Viterbi detector implements a trellis diagram and has a predetermined number of states for conducting maximum likelihood sequence estimation for a predetermined stream of binary data, the Viterbi detector comprising:

a branch metric unit which receives the stream of binary data, determines a branch metric value for each state at a time k+1, and outputs the branch metric value for time k+1; and an adding unit which receives the branch metric value for time k+1 and adds the branch metric value to a state metric value for time k for each state, wherein the state metric value is represented by a number of bits (g+h'), wherein g is the number of bits needed to represent the branch metric value, wherein h' is the additional number of bits needed to represent the state metric value, and wherein the additional number of bits (h') is less than the additional number of bits (h) determined using the following inequality: $2^{h-1}-h \geq K-1$, wherein K represents the constraint length of the trellis diagram.

13. The Viterbi detector of claim 12, wherein the additional number of bits (h') needed to represent the state metric value is determined using the following inequality:

$$2^{g+h'}-[2^{g+1}-3+2^{g+h'-1}-2^g+(h'-1)\times Q_{max}] \geq D_{max}+1$$

wherein $D_{max}$ represents the maximum difference between Viterbi state metric values over all state pairs and over all time and $Q_{max}$ represents the upper bound of the binary representation branch metric value Q.

14. The Viterbi detector of claim 12, wherein the adding unit comprises g+h' number of adders.

* * * * *